United States Patent
Huang et al.

(10) Patent No.: US 10,460,959 B2
(45) Date of Patent: Oct. 29, 2019

(54) PACKAGE STRUCTURE AND MANUFACTURING METHOD THEREOF

(71) Applicant: Powertech Technology Inc., Hsinchu County (TW)

(72) Inventors: Kun-Yung Huang, Hsinchu County (TW); Yen-Ju Chen, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/922,849

(22) Filed: Mar. 15, 2018

(65) Prior Publication Data
US 2019/0287820 A1   Sep. 19, 2019

(51) Int. Cl.
*H01L 21/56*   (2006.01)
*H01L 21/768*   (2006.01)
(Continued)

(52) U.S. Cl.
CPC ...... *H01L 21/568* (2013.01); *H01L 21/76802* (2013.01); *H01L 21/76843* (2013.01);
(Continued)

(58) Field of Classification Search
CPC ....... H01L 24/11; H01L 24/14; H01L 21/568; H01L 2021/6006; H01L 23/5226; H01L 2224/03001; H01L 2224/03002; H01L 2224/023; H01L 2224/0231; H01L 2224/0233; H01L 2224/02331; H01L 2224/02333; H01L 21/76802–21/76805; H01L 24/02–24/17; H01L 24/81–24/82
See application file for complete search history.

(56) References Cited

U.S. PATENT DOCUMENTS

| 6,383,911 B2 | 5/2002 | Mikagi |
| 9,355,881 B2 * | 5/2016 | Goller .................. H01L 21/304 |

(Continued)

FOREIGN PATENT DOCUMENTS

| CN | 102163561 | 8/2011 |
| TW | I584387 | 5/2017 |

OTHER PUBLICATIONS

"Office Action of Taiwan Counterpart Application," dated Apr. 8, 2019, p. 1-5.

*Primary Examiner* — Jose R Diaz
(74) *Attorney, Agent, or Firm* — JCIPRNET

(57) ABSTRACT

A manufacturing method of a package structure is provided. The method includes the following steps. A semiconductor chip is bonded on a carrier, wherein the semiconductor chip comprises a plurality of conductive pads. An insulating material layer is formed over the carrier and encapsulating the semiconductor chip, wherein a thickness of the insulating material layer is greater than a thickness of the semiconductor chip. A first surface of the insulating material layer is patterned to form first openings that expose the conductive pads of the semiconductor chip, and second openings that penetrate through the insulating material layer. A plurality of conductive posts is formed in the first openings, wherein the plurality of conductive posts is electrically connected to the plurality of conductive pads of the semiconductor chip. A plurality of conductive vias is formed in the second opening.

10 Claims, 8 Drawing Sheets

(51) Int. Cl.
   *H01L 23/00*    (2006.01)
   *H01L 23/31*    (2006.01)
   *H01L 23/522*   (2006.01)

(52) U.S. Cl.
   CPC ...... *H01L 23/3114* (2013.01); *H01L 23/5226* (2013.01); *H01L 24/08* (2013.01); *H01L 24/11* (2013.01); *H01L 24/14* (2013.01); *H01L 2224/0231* (2013.01); *H01L 2224/02372* (2013.01)

(56) References Cited

U.S. PATENT DOCUMENTS

| | | | |
|---|---|---|---|
| 9,431,369 B2 * | 8/2016 | Chih | H01Q 1/2283 |
| 9,601,463 B2 | 3/2017 | Yu et al. | |
| 9,691,711 B2 | 6/2017 | Mahajan et al. | |
| 9,991,216 B2 * | 6/2018 | Liao | |
| 10,037,961 B2 * | 7/2018 | Chiu | H01L 24/14 |
| 2014/0103527 A1 | 4/2014 | Marimuthu et al. | |
| 2016/0141228 A1 * | 5/2016 | Leobandung | H01L 23/481 |
| | | | 257/621 |

* cited by examiner

PACKAGE STRUCTURE AND MANUFACTURING METHOD THEREOF

BACKGROUND OF THE INVENTION

1. Field of the Invention

The disclosure relates to a package structure, in particular, relates to a package structure and a manufacturing method thereof.

2. Description of Related Art

In order for electronic apparatus design to achieve being light, slim, short, and small, semiconductor packaging technology has kept progressing in attempt to develop products that are smaller in volume, lighter in weight, higher in integration, and more competitive in market. However, the process complexity of the semiconductor packages becomes increasingly challenging as the dimension of these packages decreases. Therefore, how to miniaturize the semiconductor package while maintaining the process simplicity has become a challenge to researchers in the field.

SUMMARY OF THE INVENTION

The disclosure provides a package structure and a manufacturing method thereof, whereby the manufacturing process is simplified and the manufacturing cost is reduced.

The present disclosure provides a manufacturing method of a package structure including the following steps. A carrier is provided. A semiconductor chip is bonded on the carrier, wherein the semiconductor chip comprises a plurality of conductive pads. An insulating material layer is formed over the carrier and encapsulating the semiconductor chip, wherein the insulating material layer comprises a first surface and a second surface opposite to the first surface, and a thickness of the insulating material layer is greater than a thickness of the semiconductor chip. The first surface of the insulating material layer is patterned to form first openings that expose the conductive pads of the semiconductor chip, and second openings that penetrate through the insulating material layer. A plurality of conductive posts is formed in the first openings, wherein the plurality of conductive posts is electrically connected to the plurality of conductive pads of the semiconductor chip. A plurality of conductive vias is formed in the second opening. A redistribution layer is formed over the first surface of the insulating material layer, wherein the redistribution layer is electrically connected to the plurality of conductive posts and the plurality of conductive vias. The carrier is de-bonded. A plurality of conductive terminals is formed on the second surface of the insulating material layer, wherein the plurality of conductive terminals is electrically connected to the redistribution layer through the plurality of conductive vias.

The disclosure provides a package structure including a semiconductor chip, an insulating material layer, a plurality of conductive vias, a plurality of conductive posts, a redistribution layer and a plurality of conductive terminals. The semiconductor chip includes a plurality of conductive pads. The insulating material layer is encapsulating the semiconductor die, wherein the insulating material layer has a first surface and a second surface opposite to the first surface, and a thickness of the insulating material layer is greater than a thickness of the semiconductor chip. The plurality of conductive vias is disposed on the first surface of the insulating material layer and penetrating through the insulating material layer. The plurality of conductive posts is disposed on the first surface of the insulating material layer and electrically connected to the semiconductor chip. The redistribution layer is disposed on the first surface of the insulating material layer and electrically connected to the plurality of conductive vias and the plurality of conductive posts. The plurality of conductive terminals is disposed on the second surface of the insulating material layer and electrically connected to the plurality of conductive vias.

Based on the above, the package structure of the disclosure is formed by first forming the insulating material layer, patterning the insulating material layer to form first and second openings, then forming conductive posts and conductive vias within the first and second openings. As such, the thinning steps required for planarizing the surfaces of the conductive vias, the semiconductor chip and the insulating encapsulant in conventional processes may be omitted. In other words, the manufacturing process of the packages structure is simplified, and material cost is reduced.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
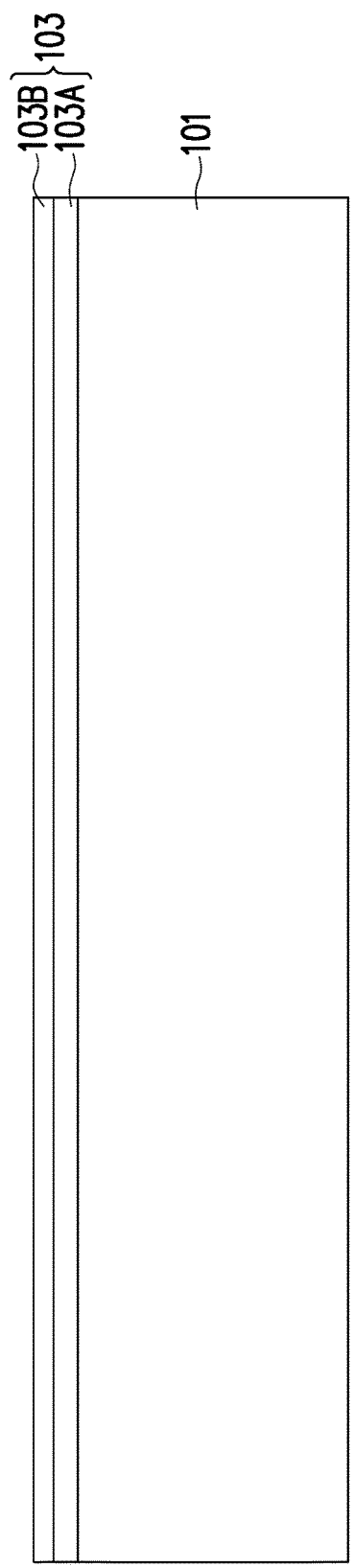
FIG. 1 to FIG. 8 are schematic cross-sectional views illustrating a manufacturing method of a packaging structure according to an embodiment of the disclosure.

Reference will now be made in detail to the present preferred embodiments of the invention, examples of which are illustrated in the accompanying drawings. Wherever possible, the same reference numbers are used in the drawings and the description to refer to the same or like parts.

FIG. 1 to FIG. 8 are schematic cross-sectional views illustrating a manufacturing method of package structure according to an embodiment of the invention. Referring to FIG. 1, a carrier 101 is provided. The carrier 101 may be made of silicon, polymer, or other suitable materials. In some other embodiments, the carrier 101 may be a glass substrate or a glass supporting board. Other suitable substrate materials may be adapted as the carrier 101 as long the material is able to withstand the subsequent process while carrying the package structure formed thereon. As shown in FIG. 1, a buffer layer 103 is formed on the carrier 101. In some embodiments, the buffer layer 103 may include a release layer 103A and a dielectric layer 103B. The dielectric layer 103B may be made of a dielectric material including benzocyclobutene ("BCB"), polybenzooxazole ("PBO"), or any other suitable polymer-based dielectric material. The release layer 103A is, for example, a light to heat conversion (LTHC) layer, and enables room temperature de-bonding from the carrier by applying laser irradiation. However, this construes no limitation in the invention. In alternative embodiments, other types of materials may be used as the release layer 103A depending on requirement.

Figure 2:
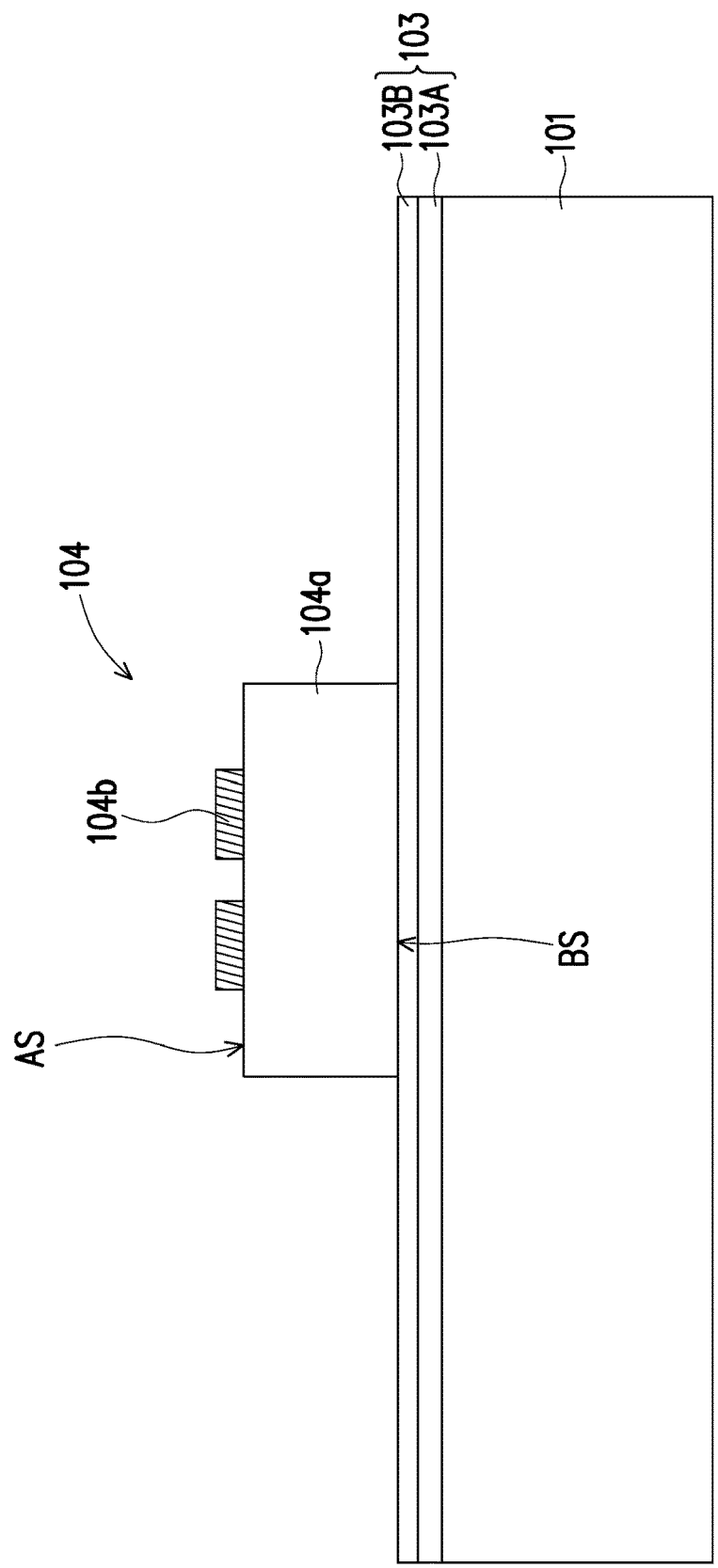

Referring to FIG. 2, a semiconductor chip 104 is bonded on the carrier 101. In certain embodiments, the semiconductor chip 104 is bonded on the carrier 101 through a die attach film (not shown). As illustrated in FIG. 2, the semiconductor chip 104 comprises a semiconductor substrate 104a and a plurality of conductive pads 104b disposed on the semiconductor substrate 104a. The semiconductor substrate 104a may be a bulk silicon substrate or a silicon-on-insulator (SOI) substrate. Furthermore, the semiconductor substrate 104a may include active components (e.g., transistors or the like) and, optionally, passive components (e.g., resistors, capacitors, inductors or the like) formed therein. The conductive pads 104b may be aluminum pads, copper pads or other suitable metallic pads. In the exemplary embodiment, the semiconductor chip 104 has an active surface AS and a backside surface BS opposite to the active surface AS. The plurality of conductive pads 104b is located on the active surface AS of the semiconductor chip 104, while the backside surface BS of the semiconductor chip 104 is adhered to the buffer layer 103.

Figure 3:
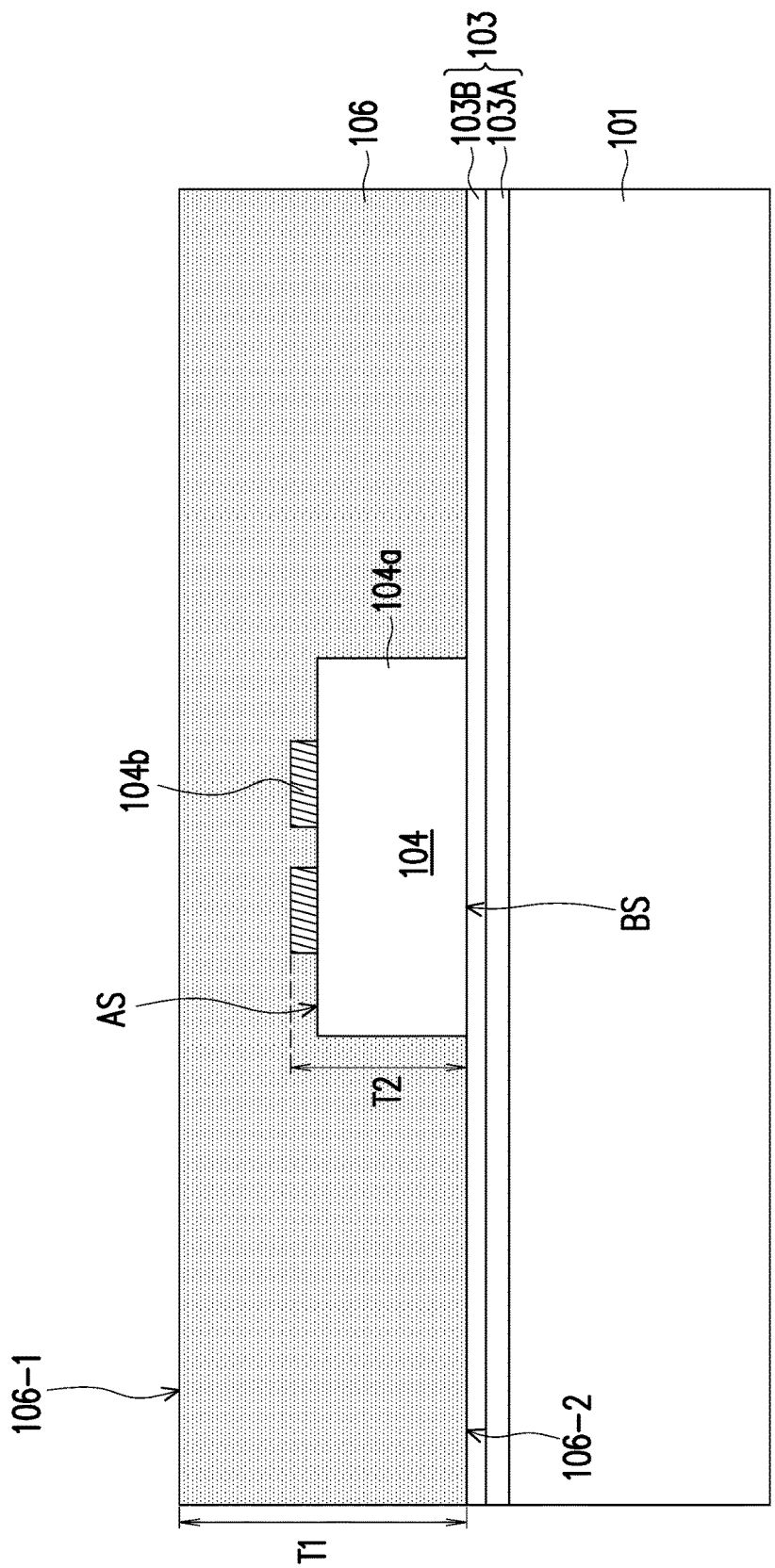

Referring to FIG. 3, an insulating material layer 106 is formed over the carrier 101 to encapsulate the semiconductor chip 104. The insulating material layer 106 is, for example, a photosensitive insulating material layer including photosensitive materials such as benzocyclobutene, polybenzoxazole, epoxy, polyimide, or any other suitable photosensitive insulating materials. In some embodiments, the insulating material layer 106 may include fillers distributed therein. However, this construes no limitation in the invention. In some other embodiments, no fillers are added to the insulating material layer 106. Furthermore, as illustrated in FIG. 3, a thickness T1 of the insulating material layer 106 is greater than a thickness T2 of the semiconductor chip 104. In some embodiments, the thickness T1 of the insulating material layer 106 is in a range of 200 µm to 250 µm. In the exemplary embodiment, the conductive pads 104b of the semiconductor chip 104 is encapsulated and well protected by the insulating material layer 106. In other words, the semiconductor chip 104 is not revealed from the insulating material layer 106 at this stage. In addition, the insulating material layer 106 has a first surface 106-1 and a second surface 106-2 opposite to the first surface 106-1. The first surface 106-1 of the insulating material layer 106 is facing away from the carrier 101, whereas the second surface 106-2 of the insulating material layer 106 is in physical contact with the buffer layer 103.

Figure 4:
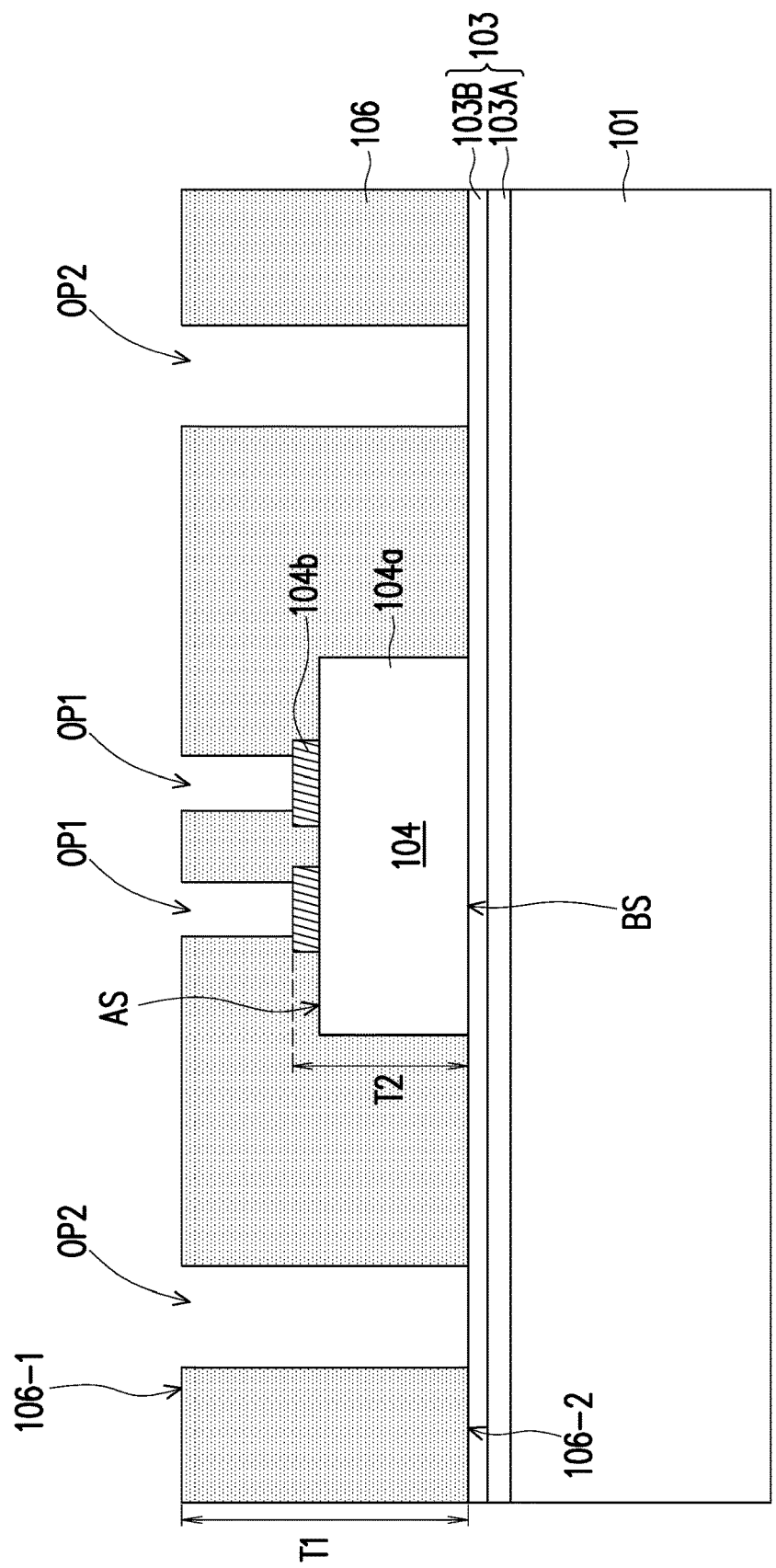

Referring to FIG. 4, after forming the insulating material layer 106, the first surface 106-1 of the insulating material layer 106 is patterned to form first openings OP1 and second openings OP2. In the illustrated embodiment, the first openings OP1 exposes the conductive pads 104b of the semiconductor chip 104, whereas the second openings OP2 penetrate through the insulating material layer 106. In other words, the second openings OP2 penetrates from the first surface 106-1 of the insulating material layer 106 through to the second surface 106-2 to reveal the buffer layer 103 located underneath. In some embodiments, the insulating material layer 106 is patterned by a lithography process. As the insulating material layer 106 is made of photosensitive insulating materials, the insulating material layer 106 may be effectively patterned through lithography. However, this construes no limitation in the invention. In some other embodiments, the insulating material layer 106 may be patterned through other processes.

Figure 5:
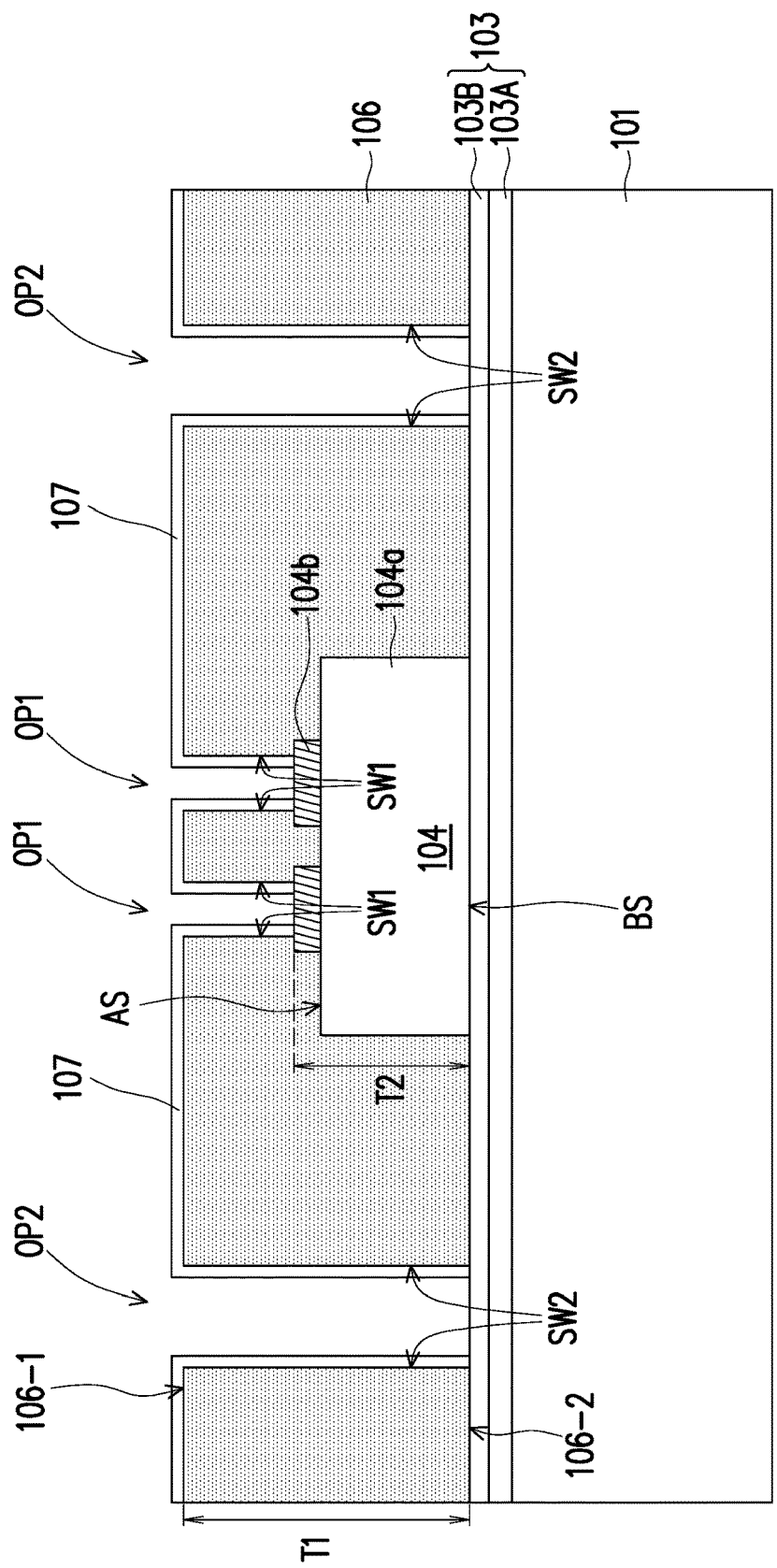

Referring to FIG. 5, after defining the first openings OP1 and the second openings OP2, a seed layer 107 is formed to cover the insulating material layer 106. The seed layer 107 may, for example, be formed by a physical vapor deposition (PVD) process. In some embodiments, a material of the seed layer 107 may include a titanium layer, a copper layer or the like. Furthermore, as shown in FIG. 5, the seed layer 107 may cover the first surface 106-1 of the insulating material layer 106, fill into the first opening OP1 to cover sidewalls SW1 of the first opening OP1, and fill into the second opening OP2 to cover sidewalls SW2 of the second opening OP2.

Figure 6:
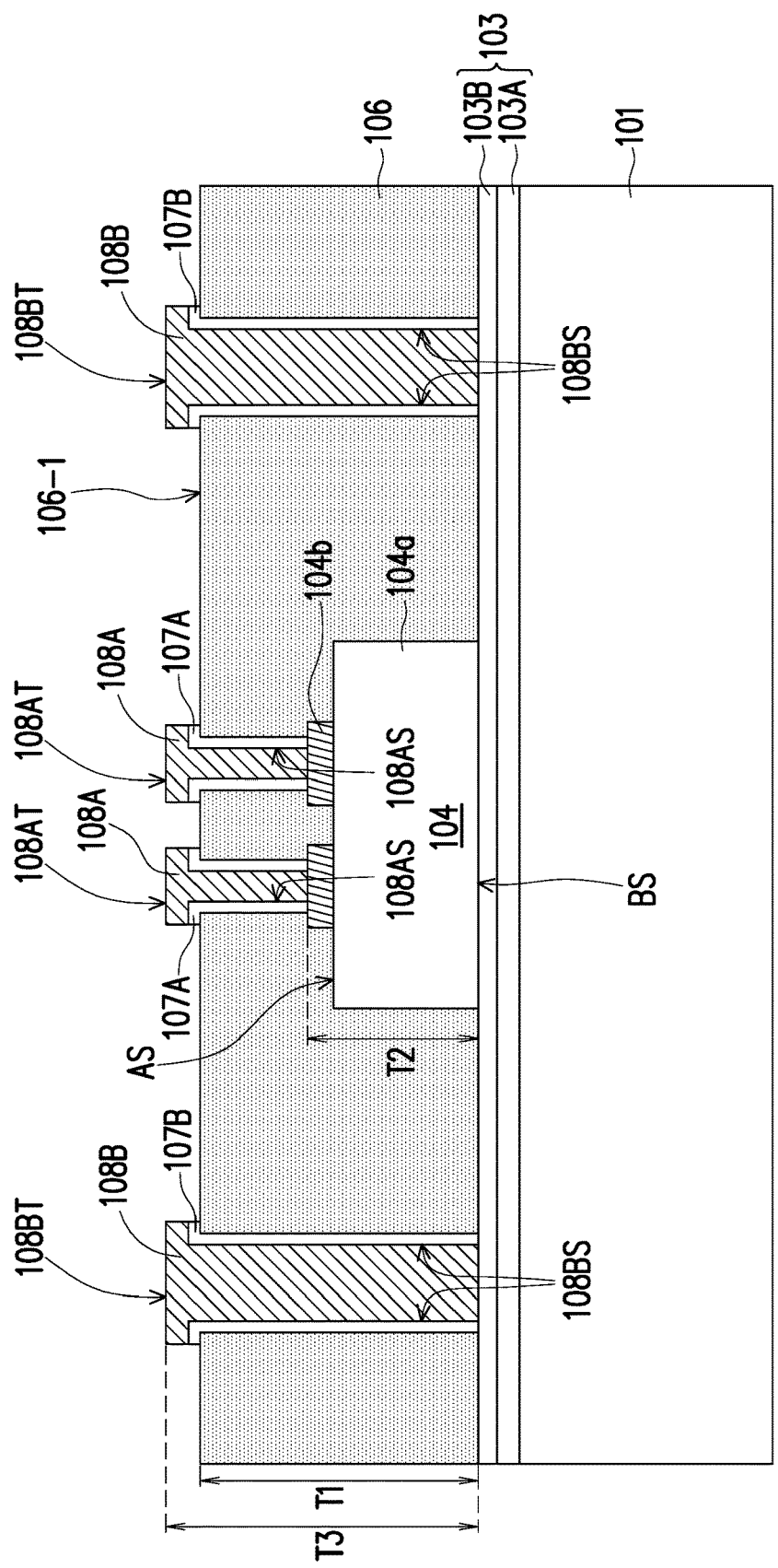

Referring to FIG. 6, after forming the seed layer 107, a conductive material layer (not shown) is formed to cover the seed layer 107 to fill the first opening OP1 and the second opening OP2. The conductive material layer and the seed layer 107 located underneath may then be patterned to form a plurality of conductive posts 108A, a plurality of conductive vias 108B, first seed layers 107A and second seed layers 107B. In some embodiments, a material of the conductive material layer includes copper or copper alloys, but the disclosure is not limited thereto. In certain embodiments, the conductive vias 108B are through insulator vias or through fan-out vias.

As illustrated in FIG. 6, the plurality of conductive posts 108A is filled within the first openings OP1 and extending over a level of the first opening OP1. In other words, the conductive posts 108A are disposed within and extending over the first surface 106-1 of the insulating material layer 106 and are electrically connected to conductive pads 104b of the semiconductor chip 104. In some embodiments, the plurality of conductive vias 108B is filled in the second openings OP2, and extends over a level of the second openings OP2. In other words, the conductive vias 108B are disposed within and extends over the first surface 106-1 of the insulating material layer 106 and penetrating through the insulating material layer 106. As shown in FIG. 6, an upper surface 108BT of the plurality of conductive vias 108B is substantially coplanar with an upper surface 108AT of the plurality of conductive posts 108A. The upper surfaces (108AT/108BT) of the conductive vias 108B and the conductive posts 108A may be at a height from a level of the first surface 106-1 of the insulating material layer 106. Furthermore, a height T3 of the plurality of conductive vias 108B is greater than the thickness T1 of the insulating material layer 106.

In the exemplary embodiment, after the patterning process, the seed layer 107 may be separated into first seed layers 107A and second seed layers 107B. As shown in FIG. 6, the first seed layers 107A may be sandwiched in between the conductive posts 108A and the insulating material layer 106, whereas the first seed layers 107A covers the sidewalls 108AS of the conductive posts 108A. In a similar way, the second seed layers 107B may be sandwiched in between the conductive vias 108B and the insulating material layer 106, whereas the second seed layers 107B covers the sidewalls 108BS of the conductive vias 108B.

Figure 7:
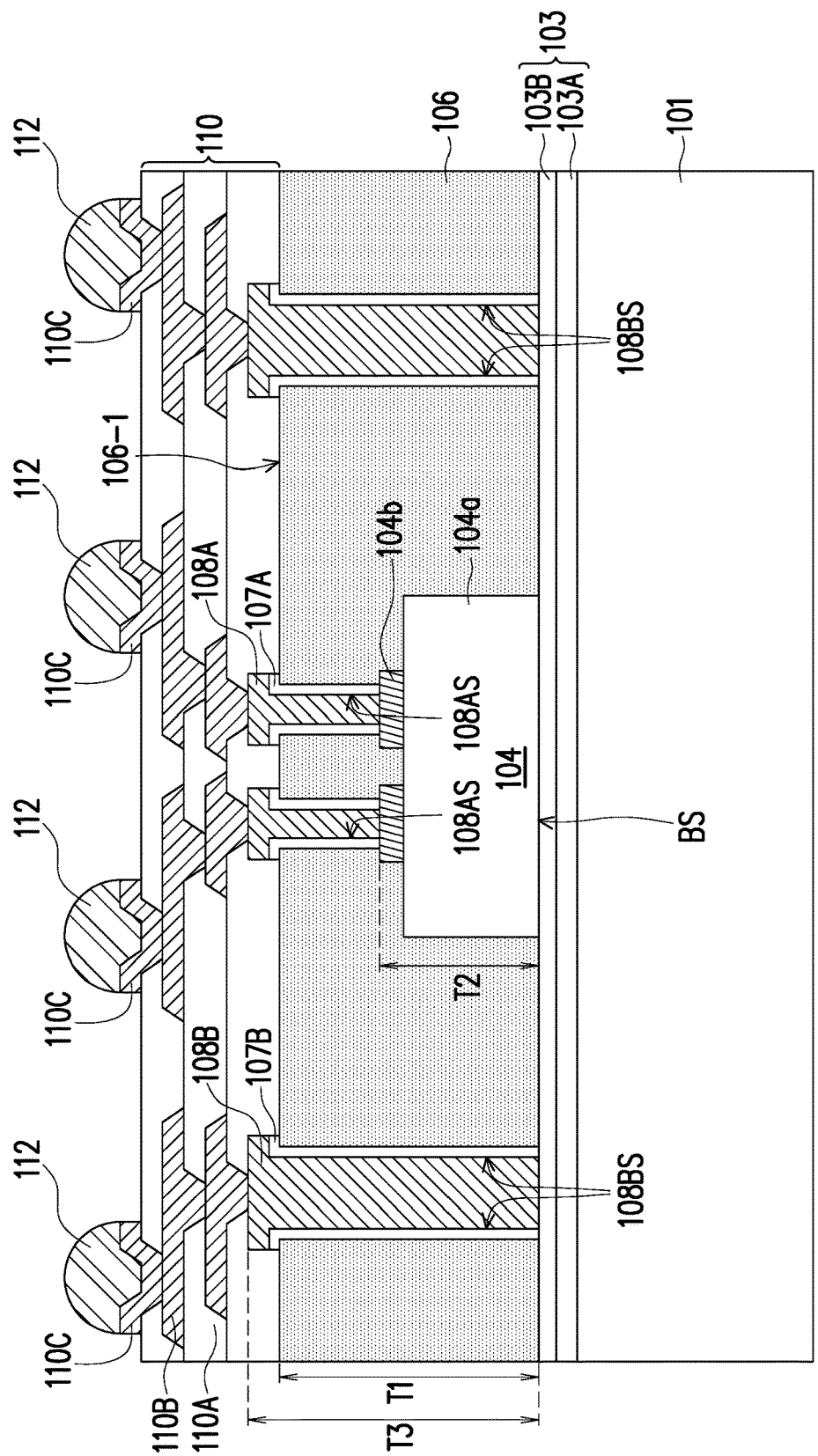

Referring to FIG. 7, after forming the conductive posts 108A and the conductive vias 108B, a redistribution layer 110 is formed over the first surface 106-1 of the insulating material layer 106, the conductive posts 108A, and the conductive vias 108B. The redistribution layer 110 may include a plurality of dielectric layers 110A and a plurality of conductive elements 110B alternately stacked. The plurality of dielectric layers 110A may be made of non-organic or organic dielectric materials such as silicon oxide, silicon nitride, silicon carbide, silicon oxynitride, polyimide, benzocyclobutene (BCB), or the like. The plurality of conductive elements 110B may be made of copper, aluminum, nickel, or other suitable conductive materials. Although only two layers of the conductive elements 110B and three layers of dielectric layers 110A are illustrated herein, the scope of the disclosure is not limited thereto. In other embodiments, the number of conductive elements 110B and the dielectric layers 110A may be determined based on product requirement. In some embodiments, the conductive elements 110B of the redistribution layer 110 are electrically connected to the plurality of conductive vias 108B and the plurality of conductive posts 108A.

After forming the redistribution layer 110, a plurality of conductive balls 112 may be placed on the redistribution layer 110. The conductive balls 112 may include materials such as copper, tin, gold, nickel or other suitable conductive materials. In some embodiments, the topmost dielectric layer 110A of the redistribution layer 110 may include a plurality of conductive pads 110C formed thereon. The conductive pads 110C are for example, under-ball metallurgy (UBM) patterns used for ball mount. In certain embodiments, the conductive balls 112 are placed on the conductive pads 112C through a ball placement process. In some embodiments, the conductive balls 112 is electrically connected to the semiconductor chip 104 and the plurality of conductive vias 108B through the conductive elements 110B of the redistribution layer 110.

Figure 8:
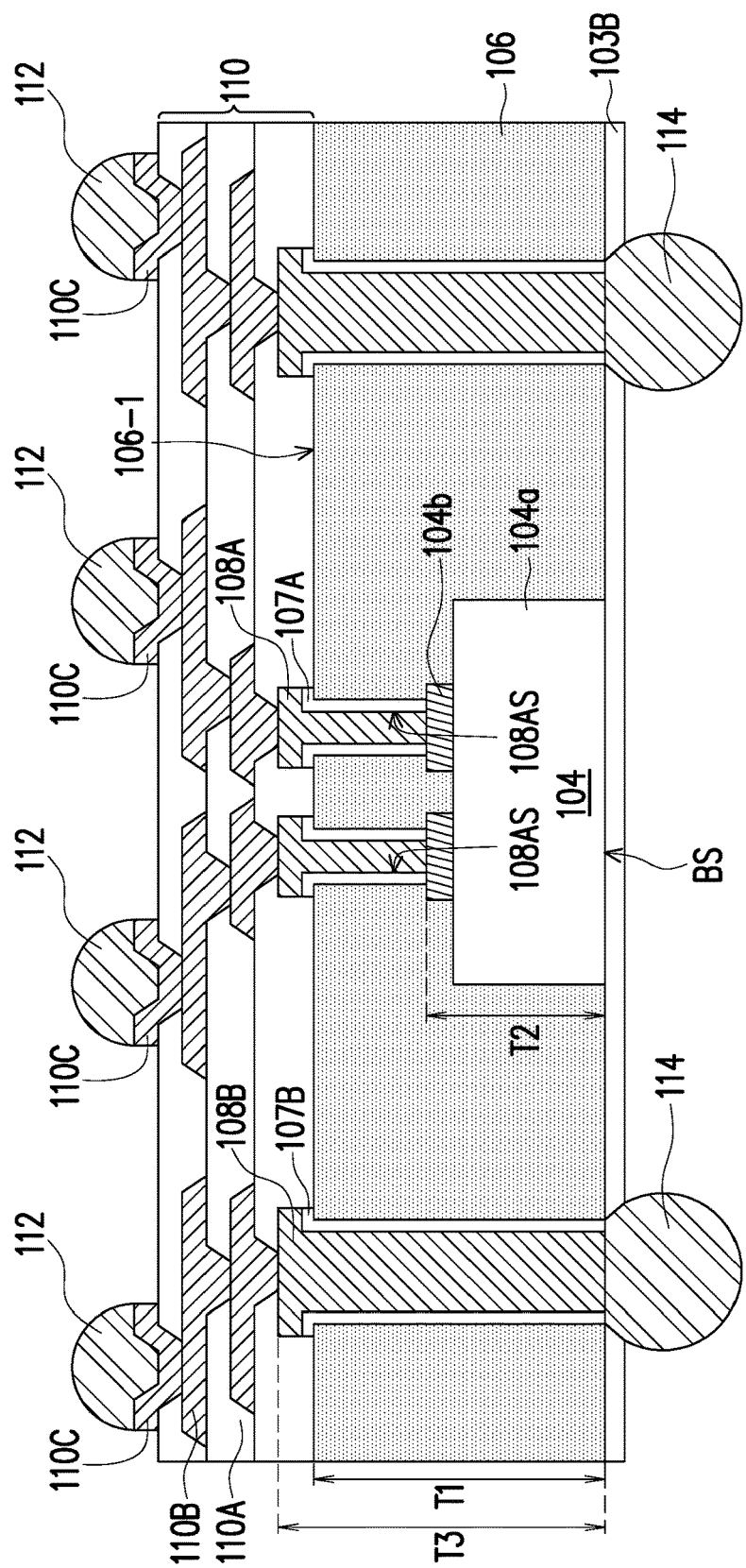

Referring to FIG. 8, after forming the conductive balls 112, the carrier 101 is de-bonded. For example, the dielectric layer 103B is de-bonded from the release layer 103A so that the release layer 103A and the carrier 101 are separated from the insulating material layer 106 and the semiconductor chip 104. In some embodiments, the carrier 101 may be de-bonded by peeling off the release layer 103A. External energy such as UV laser, visible light, or heat is applied to the release layer 103A. Other suitable techniques may be used for the peeling process. Furthermore, as shown in FIG. 8, the dielectric layer 103B is then patterned to form contact openings that expose the bottom surfaces of the conductive vias 108B (through vias). For example, the contact openings of the dielectric layer 103B are formed by a laser drilling process. After the contact openings are formed, a plurality of conductive terminals 114 is disposed on the second surface 106-2 of the insulating material layer 106 and filled within the contact openings. The conductive terminals 114 are electrically connected to the redistribution layer 110 through the plurality of conductive vias 108B. In the illustrated embodiment, after the conductive balls 112 and the conductive terminals 114 are formed, a package structure having dual-side terminals is accomplished.

In the above embodiments, the package structure of the disclosure is formed by first forming the insulating material layer, patterning the insulating material layer to form first and second openings, then forming conductive posts and conductive vias within the first and second openings. As the insulating material layer of the disclosure is patterned to form openings prior to the formation of the conductive posts and conductive vias, the conductive posts and conductive vias may be easily defined within the openings by a simplified process. In addition, the thinning steps required for planarizing the surfaces of the conductive vias, the semiconductor chip and the insulating encapsulant in conventional processes may be omitted. In other words, the manufacturing process of the packages structure is simplified, and material cost is reduced.

It will be apparent to those skilled in the art that various modifications and variations can be made to the structure of the invention without departing from the scope or spirit of the invention. In view of the foregoing, it is intended that the present invention cover modifications and variations of this invention provided they fall within the scope of the following claims and their equivalents.

What is claimed is:

1. A manufacturing method of a package structure, comprising:
    providing a carrier;
    bonding a semiconductor chip on the carrier, wherein the semiconductor chip comprises a plurality of conductive pads exposed at an active surface of the semiconductor chip;
    forming an insulating material layer over the carrier and encapsulating the semiconductor chip after the semiconductor chip is bonded on the carrier, wherein the insulating material layer comprises a first surface and a second surface opposite to the first surface, a thickness of the insulating material layer is greater than a thickness of the semiconductor chip, and the plurality of conductive pads are covered by the insulating material layer;
    patterning the first surface of the insulating material layer to form first openings that expose the conductive pads of the semiconductor chip, and second openings that penetrate through the insulating material layer;
    forming a plurality of conductive posts in the first openings, wherein the plurality of conductive posts is electrically connected to the plurality of conductive pads of the semiconductor chip, and the plurality of conductive posts extend onto the first surface of the insulating layer;
    forming a plurality of conductive vias in the second openings, wherein the plurality of conductive vias extend onto the first surface of the insulating layer;
    forming a redistribution layer over the first surface of the insulating material layer, wherein the redistribution layer is electrically connected to the plurality of conductive posts and the plurality of conductive vias;
    de-bonding the carrier; and
    forming a plurality of conductive terminals on the second surface of the insulating material layer, wherein the plurality of conductive terminals is electrically connected to the redistribution layer through the plurality of conductive vias.

2. The manufacturing method of a package structure according to claim 1, further comprising:
    forming a seed layer covering the insulating material layer and covering sidewalls of the first openings and sidewalls of the second openings, wherein the seed layer is formed prior to the forming of the plurality of conductive posts and prior to the forming of the plurality of conductive vias.

3. The manufacturing method of a package structure according to claim 2, wherein the seed layer comprises a titanium layer or a copper layer.

4. The manufacturing method of a package structure according to claim 1, wherein the insulating material layer is a photosensitive insulating material layer.

5. The manufacturing method of a package structure according to claim 4, wherein the thickness of the insulating material layer is in the range of 200 µm to 250 µm.

6. The manufacturing method of a package structure according to claim 1, wherein the insulating material layer is patterned by a lithography process.

7. The manufacturing method of a package structure according to claim 1, further comprising:
    forming a release layer on the carrier prior to bonding the semiconductor chip on the carrier, wherein the release layer and the carrier are separated from the insulating material layer and the semiconductor chip during the de-bonding process.

8. The manufacturing method of a package structure according to claim 7, wherein the release layer and the carrier are separated from the insulating material layer and the semiconductor chip after irradiation with UV light.

9. The manufacturing method of a package structure according to claim 1, wherein a height of the plurality of conductive vias is greater than the thickness of the insulating material layer.

10. The manufacturing method of a package structure according to claim 1, further comprising:
   forming a plurality of conductive balls on the redistribution layer, wherein the plurality of conductive balls is electrically connected to the semiconductor chip and the plurality of conductive vias through the redistribution layer.

* * * * *